United States Patent [19]

Glendinning

[11] 4,194,187

[45] Mar. 18, 1980

[54] ANALOG-TO-DIGITAL CONVERSION BY CHARGE COUPLED DEVICE

[75] Inventor: William B. Glendinning, Red Bank, N.J.

[73] Assignee: The United States of America as represented by the Secretary of the Army, Washington, D.C.

[21] Appl. No.: 931,638

[22] Filed: Aug. 7, 1978

[51] Int. Cl.² .................................... H03K 13/02
[52] U.S. Cl. .................. 340/347 AD; 307/221 D; 340/347 M; 357/24
[58] Field of Search .... 340/347 M, 347 AD, 347 NT; 357/24; 307/221 C, 221 D

[56] References Cited

U.S. PATENT DOCUMENTS

| | | | |
|---|---|---|---|
| 3,930,255 | 12/1975 | Means | 340/347 AD |
| 4,072,938 | 2/1978 | Buchanan | 340/347 AD |
| 4,072,939 | 2/1978 | Heller et al. | 340/347 AD |
| 4,087,812 | 5/1978 | Terman | 357/24 X |
| 4,115,766 | 9/1978 | Smith | 357/24 X |

Primary Examiner—Thomas J. Sloyan
Attorney, Agent, or Firm—Nathan Edelberg; Jeremiah G. Murray; Bernard Franz

[57] ABSTRACT

A relatively high speed analog-to-digital converter is a charged coupled device preferably formed as a metal-oxide semiconductor integrated circuit. It includes a pair of potential charge packet wells, an electrode gate to control the transfer of charge packets in a seesaw manner between the two wells, electrode gates to control the dissipation of charges from the wells to sinks, electrode gates to control the input of a charge representing an analog signal to one of the wells, electrode gates to control the detection of charge packets, a clock and a logic control to operate the electrode gates in a predetermined sequence.

10 Claims, 18 Drawing Figures

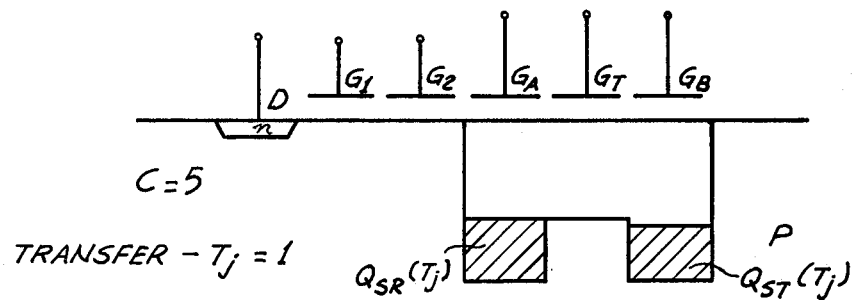
FIG.2E
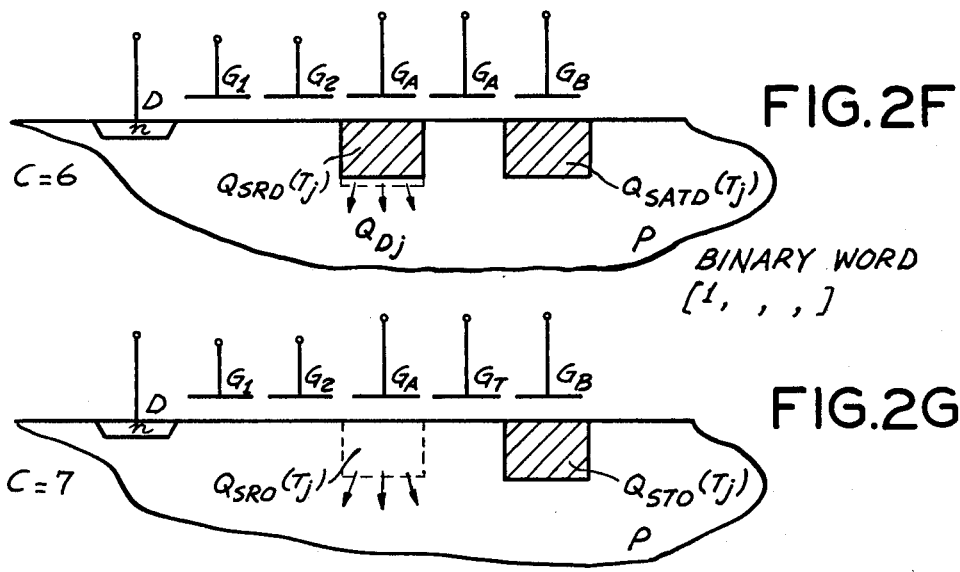
FIG.2F
FIG.2G
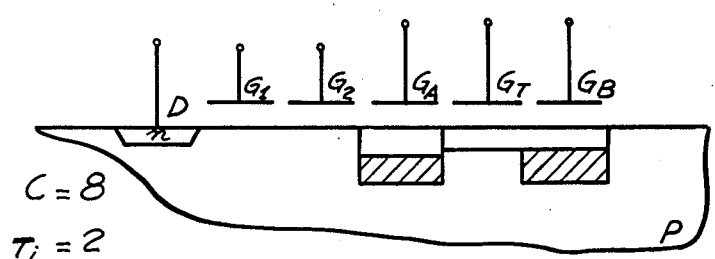
FIG.2H
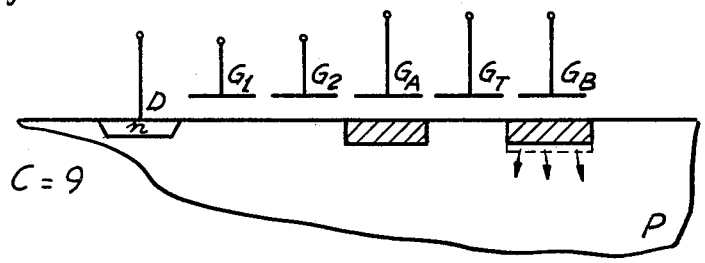
FIG.2(I)
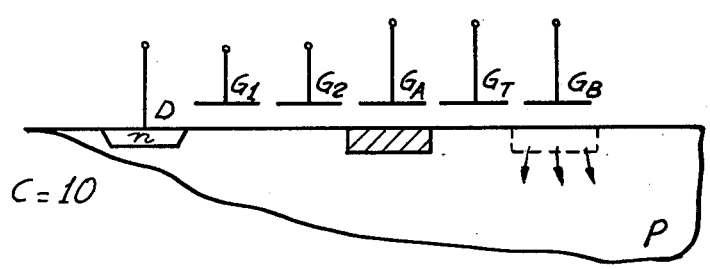
FIG.2J

[1,1,1,]

[1,1,1,1,]

ANALOG-TO-DIGITAL CONVERSION BY CHARGE COUPLED DEVICE

The invention described herein may be manufactured and used by or for the Government for governmental purposes without the payment of any royalties thereon or therefor.

BACKGROUND OF THE INVENTION

The present invention relates to an electronic analog-to-digital converter and more particularly to an analog-to-digital converter which is a charge coupled device.

An analog-to-digital converter is a device which processes, i.e., converts, a continuously variable analog signal to a digital signal, i.e., a binary code, which is a close approximation of the original analog signal. The analog input would be alternating current and the binary code may be of various forms such as serial or parallel.

There have been many different types of analog-to-digital electronic circuits and recently analog-to-digital devices which are based on the use of an integrated circuit have become commercially available. An integrated circuit (IC) is a combination of circuit elements interconnected on a continuous substrate. Frequently the substrate is a base chip (which may be a portion of a wafer) of semiconductive silicon and the circuit may include both active and passive elements contained in a single package.

The analog-to-digital converter of the present invention is a charge coupled device (CCD). A charge coupled device is a semiconductor storage device that employs a charge transfer system in which charges controlled by a gate are contained in capacitors. The entire device may be fabricated on a single crystal wafer to form an integrated circuit. By varying the electrode gate voltages in a programmed succession determined by a logic circuit, a charge packet may be moved from one capacitor to another capacitor and then to an output amplifier. Since the capacitors may contain a controlled and variable charge, the CCD device is a means to store information represented by the charge.

The present invention is particularly directed to a metal oxide semiconductor (MOS) in which the capacitors of the CCD device are formed on the wafer of semiconductive silicon. The type of metal oxide semiconductor device presented as the preferred embodiment of the present invention is a field effect transistor metal oxide semiconductor known as a MOS-FET. In that type of integrated circuit the field effect transistor may be formed with a metal gate electrode isolated (insulated) from a semiconductor channel by an oxide film. A capacitor may be formed, in one method, with the semiconductor material as one plate, aluminum as the other plate, and an oxide between the two plates acting as a dielectric. The MOS-FET may be either an enhancement type, which is normally turned off, or the depletion type, which is normally turned on, although generally, in accordance with the preferred embodiment, the MOS-FET will be of the enhancement type. Generally MOS-FET devices may be formed using diffused source and drain regions on either side of the P or N channel region. When a control voltage is applied to the gate, the channel region is converted to the same type of semiconductor as the source or drain (either P or N), permitting a current path to be established between the source and drain.

Various types of analog-to-digital converters are presently available utilizing integrated circuits. For example, National Semiconductor Corporation has announced an analog-to-digital converter AD1210 which is a 12-bit successive approximation converter, supplied as a 24-pin package. The AD1210 device includes successive approximation logic analog switches, a precision laser trimmed thin film resistor ladder network and a field effect transistor input comparator. According to its published literature, its binary output is directly compatible with CMOS (complementary metal oxide semiconductor) logic levels. A CMOS device has both N and P channel enhancement modes fabricated onto the silicon wafer and generally connected to form push-pull digital complementary circuits. The clock rate of the AD1210 is stated as being up to 500 kHz and its conversion rate is 20 kHz.

A charge coupled device (CCD) analog-to-digital (A/D) device using a MOSFET integrated circuit (IC) is described by Eichelberger & Butler, "An Analog-to-Digital Converter Using Charge-Transfer Technology" in the *Digest of Technical Papers*, ISSCC77/Thursday, Feb. 17, 1977, Philadelphia, Pa. Sess. 1.X, pages 94,95. In the device described, the number of metered charge packets to fill a well, i.e., fill a capacitor, to a threshold level is linearly related to input d.c. voltage. During an initial period a scale factor is obtained and the number of charge packets to charge a well to a detected threshold value is counted. The implementation described in the article used a P-channel MOS chip of relatively large size (240×180 mils). Even using a high clock rate of 500 kHz, the conversion time was relatively slow, 20 ms at 10 bits resolution.

OBJECTIVES AND FEATURES OF THE INVENTION

It is an objective of the present invention to provide an analog-to-digital converter which is formed as an integrated circuit and fabricated using conventional integrated circuit fabrication methods.

It is an objective of the present invention to provide an analog-to-digital converter which is a relatively high speed device operated at a megahertz conversion rate.

It is an objective of the present invention to provide an analog-to-digital converter which has a relatively high density of active circuits and may be produced at a relatively and significantly lower cost.

It is an objective of the present invention to provide an analog-to-digital converter which has compatible performance in terms of speed and voltage level with other types of integrated CCD circuit functions such as signal processing, memory functions and imaging functions.

It is a feature of the present invention to provide an integrated circuit analog-to-digital charge control device comprising a pair of charge packet capacitor wells (a first well and a second well). Preferably the integrated circuit is formed using conventional MOSFET techniques. The circuit includes an electron gate input means to control the transfer of a charge, a plurality of charge packets $\Sigma 2^i$, to the first well. An electrode gate transfer control means is used to transfer charge packets from the first well to the second well and vice versa. An electrode gate dissipation control means is present to dissipate electrical charges from the wells by control of the gate voltages. A charge packet detection means detects the presence or absence of a charge packet to provide an output signal. An electrode gate detection control means controls the transfer of charge packets from the wells to the detection means. Logic control means connected to each of the control means control the gates to insert a charge to be measured into the first well, transfers charge packets between the first and second wells, dissipate the charges from the wells and transfers charge packets to the detection means in a programmed predetermined sequence.

BRIEF DESCRIPTION OF THE DRAWINGS

Other objectives of the present invention will be apparent from the following detailed description which provides the inventor's best mode of practicing the invention and which should be taken in conjunction with the accompanying drawings. In the accompanying drawings.

DETAILED DESCRIPTION OF THE INVENTION

Figure 1:
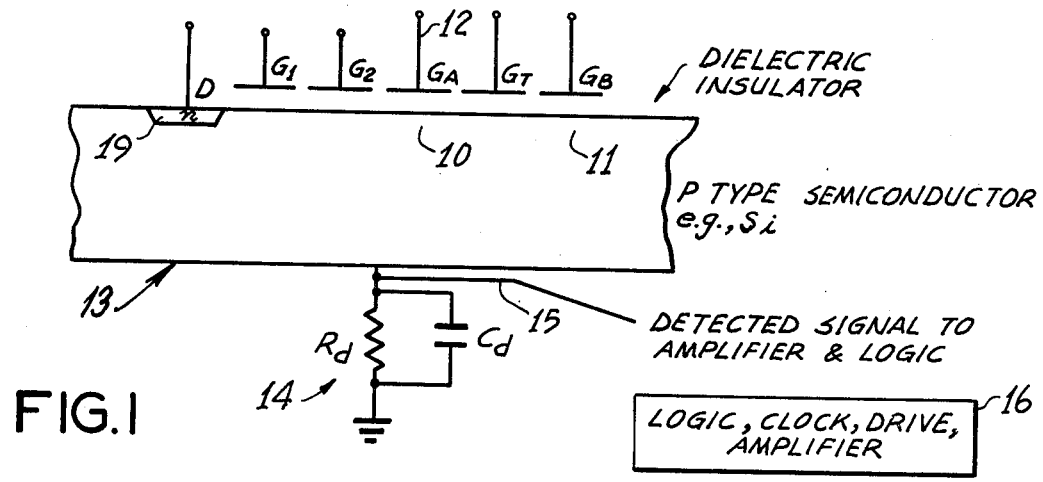
FIG. 1 is a greatly enlarged side schematic view illustrating the layout of the gates, dielectric, semiconductor substrate sink and detector and a portion of the circuitry of the integrated circuit of the present invention.
Figure 2A:
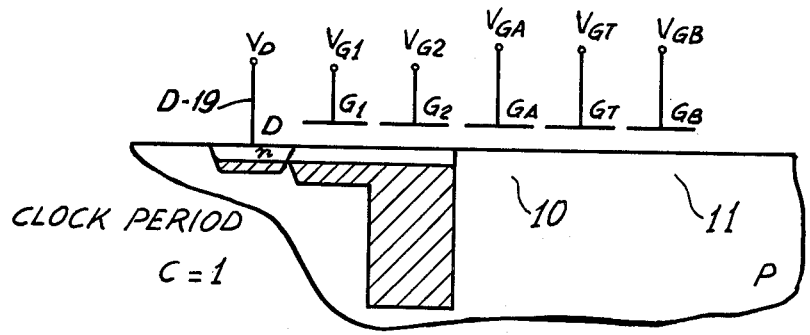
FIGS. 2A through 2P are diagrams showing the sequence of steps utilized in the analog-to-digital converter of the present invention in which each drawing shows the function performed during a sequential clock pulse.
Figure 2B:
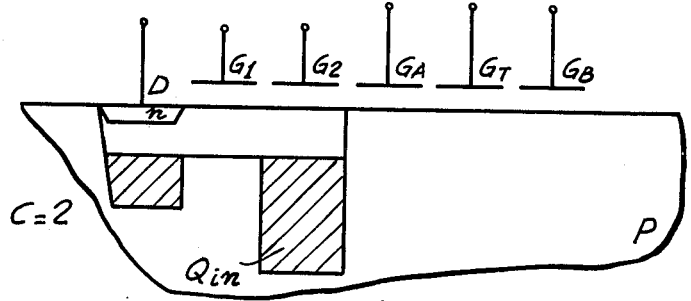
Figure 2C:
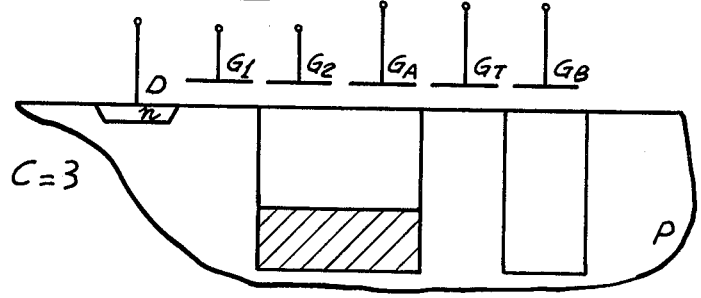
Figure 2D:
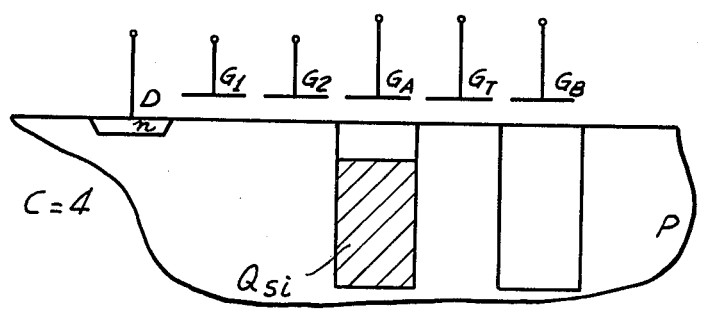
Figure 2K:
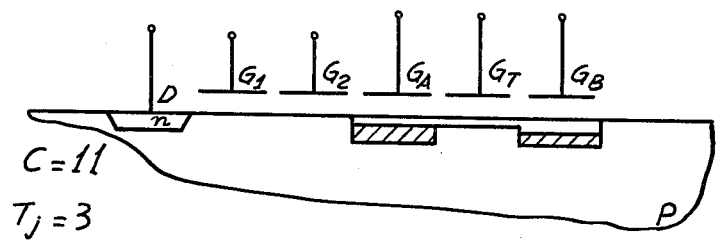
Figure 2L:
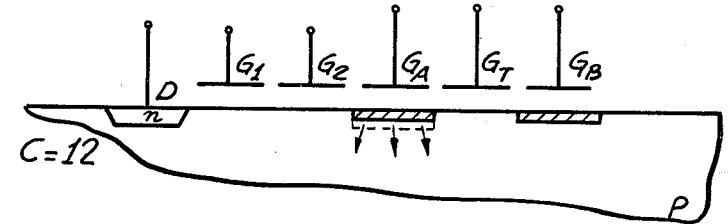
Figure 2M:
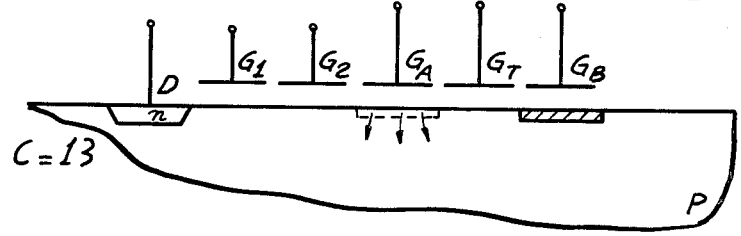
Figure 2N:
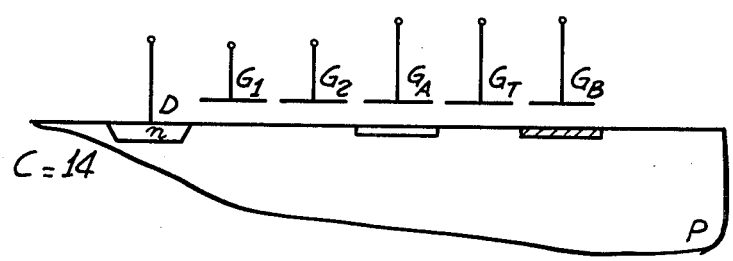
Figure 2O:
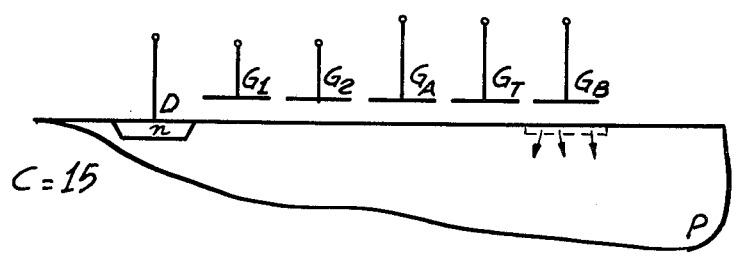
Figure 2P:
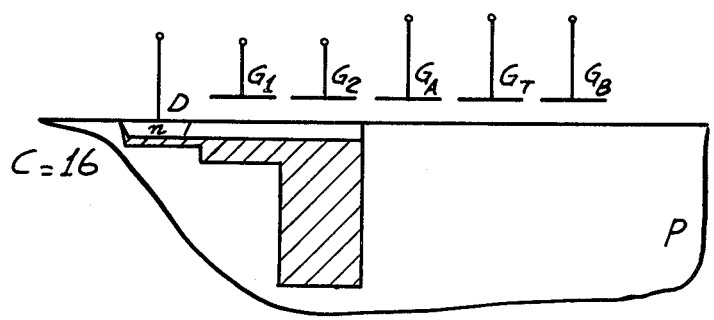

The analog-to-digital (A/D) converter shown in FIGS. 1 and 2A–2P is an integrated circuit formed as an ultra-small silicon single chip device. The device is formed using conventional metal-oxide-semiconductor (MOS) processing techniques and employs field effect transistors (MOSFETS) having a substrate, sources drains, a substrate detector and electrode gates. The integrated circuit is composed of at least two capacitors which are holding wells, MOSFETS to control charge packet injection and transfer. A separate chip includes a clock device (which may be a conventional oscillator) and a control logic, which, however, may be formed on the same chip.

Figure 3:
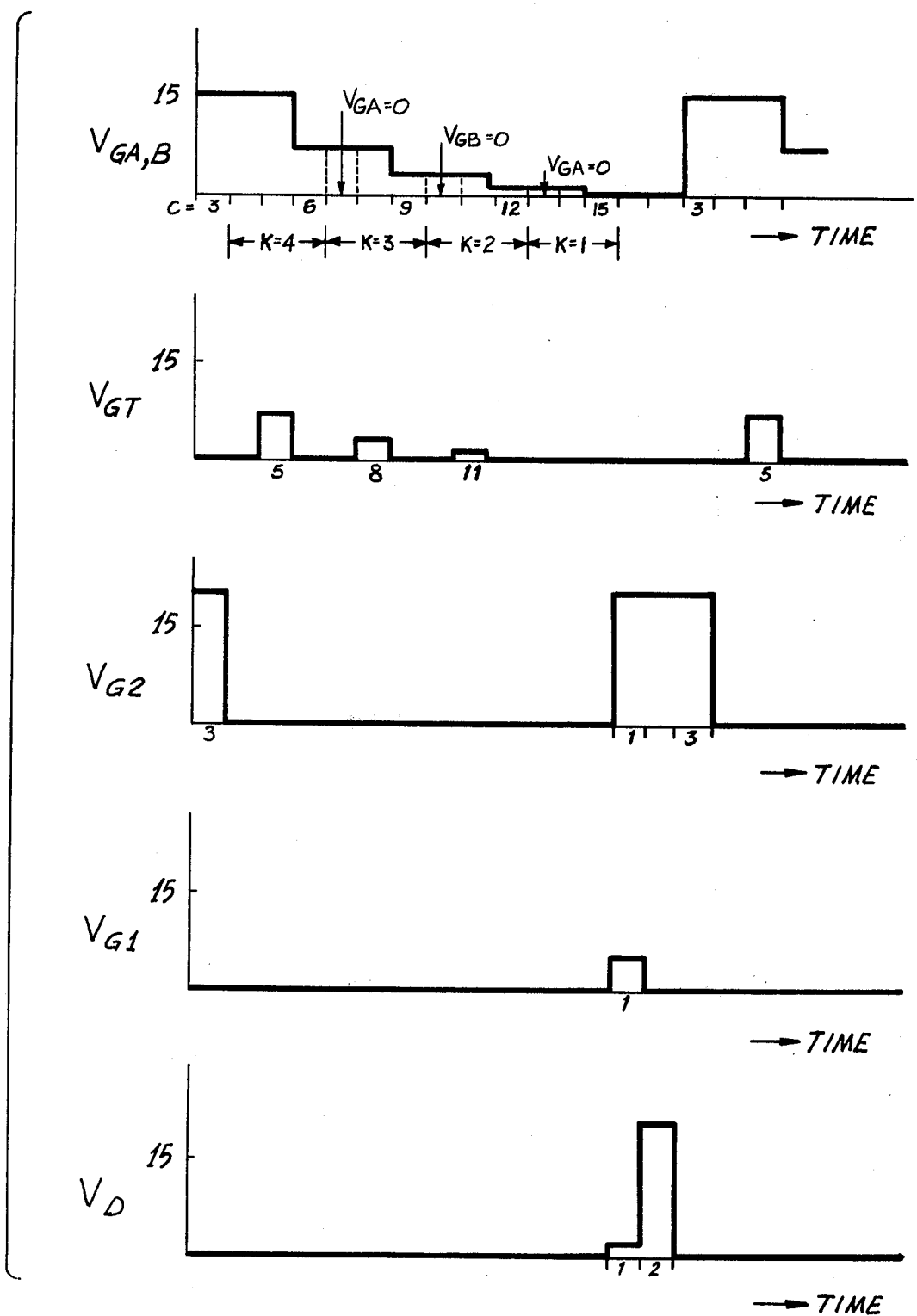
FIG. 3 is a diagram showing the time varying electrode voltages which are applied to convert one four-bit word.

An embodiment of the present invention is illustrated in the accompanying schematic diagrams of FIGS. 2 and 3 in which the magnitude of a charge packet is controlled and transferred between the two holding wells. By seesawing the total charge, representing the analog signal between the two holding wells, the total initial charge representing the analog magnitude is decomposed in a sequential manner into a series of smaller charge packets of the form $Q^i$ where $i=0$ to $i=m-1$. The presence or non-presence of each $Q^i$ component provides an output condition of a "1" state or a "0" state, respectively.

A functional layout of a 4-bit analog-to-digital converter is illustrated in FIG. 1. As shown in FIG. 1 and in FIG. 2, the charge packet is controlled and detected in two capacitors (holding wells) 10 and 11. The well GA is formed on the substrate 13 by standard MOS fabrication techniques such as applying an insulating layer such as silicon dioxide to the semiconductor substrate 13 which may be, for example, P-type silicon, which layer may be built up to a desired thickness on the substrate, and then applying a conductive layer to the dielectric layer to form a capacitor. An ohmic contact to the conductive layer completes the well connection.

Although the preferred embodiment of this invention employs the above-described capacitive type wells, any potential well fabricated by techniques well known to those skilled in the art is within the scope of this invention. The potential wells encompassed by the invention, in addition to capacitive type wells, include those utilizing homojunctions, heterojunctions and Schottky potential barriers. When the gate GA is properly activated, any charge in well 10 will be released to the substrate 13. The holding well 10 is also connected through two electrode gates $G_1$ and $G_2$ to a charge source diode D-19. The analog input signal is applied to storage electrode $G_2$ with $G_1$ electrode acting as a reference and transfer electrode.

A transfer electrode gate $G_T$ is connected between holding gates $G_A$, $G_B$ (between wells 10,11) to transfer charge packets from one well to another under control of the electrode voltage clock gate waveform control 16.

The second holding well 11 is similar to the first holding well 10. It connects and outputs to substrate 13. The second well 11 has its output to the substrate 13 by operation of electrode gate $G_B$. A detection RC circuit 14 comprising resistor $R_d$ and capacitor $C_d$ reads this output by connection 15. A charge released to the substrate 13 may either be dissipated without detection or may be detected if the logic control connects output connection 15 of detection RC circuit 14 so that its detected pulse performs some function.

Each of the gates $G_A$, $G_T$, $G_B$ and diode D is connected and controlled from the logic, clock, drive, amplifier 16. The connecting lines to the gates from the logic 16 are not shown in order to retain FIGS. 1 and 2 in a simple form for the purpose of description. The clock supplies repetitive cycles of pulse intervals, with one analog sample of the input signal being converted to an M-bit binary digital code during each cycle. The cycle may be analyzed as being divided into an input subcycle followed by M conversion subcycles of 3 pulse intervals or phases each. The conversion subcycles are designated by the sumbol K, with the first conversion subcycle having $K=M$, the second $K=M-1$, and K decreasing until its value is one for the Mth conversion subcycle. In the specific example shown in FIGS. 2 and 3, $M=4$, and K has successive values of 4, 3, 2, 1; with the input subcycle comprising the clock periods $C=1, 2$ and 3, the first conversion subcycle with $K=4$ comprises pulse periods 4, 5 and 6, continuing until with $K=1$ the clock periods are 13, 14 and 15 to end the cycle. Some of the clock pulse periods are identified on FIG. 3 on the time scale. The values of K are also shown below the time scale on the upper graph.

Referring now to FIGS. 2 and 3, the injection of the charge representing the analog numbers occurs in the first four clock periods shown sequentially in FIGS. 2A through 2D.

As shown in FIG. 2A in the first clock period (first clock pulse) the gate $G_1$ serves as a reference gate and the gate $G_2$ is the signal gate. A charge greater than the analog signal number, in this case analog 15, is entered into wells $G_1$ and $G_2$, with the charge in well $G_1$ being a fixed (reference) charge.

In the second clock period, shown in FIG. 2B, the excess charge, i.e., the amount of charge in excess of the charge representing the analog number $Q_{in}$, flows backwards (to the left in FIG. 2B) and into the source which is well D, leaving $Q_{in}$ in well $G_2$.

In the third clock period, shown in FIG. 2C, the gate $G_A$ is activated to divide and equalize the $Q_{in}$ charge into the two wells $G_2$, $G_A$. In the fourth clock period, shown in FIG. 3D, the complete charge is accumulated in well $G_A$ to form the charge $Q_{si}$.

As shown in FIG. 2D in the fourth clock pulse the analog charge equal to analog 15 has been injected to the 4-bit capacitance holding well 10-$G_A$ by gate $G_A$. The holding well 10-$G_A$ has sufficient capacity to receive a charge equal in magnitude to an analog 15, i.e., an analog charge which is equal to its corresponding binary digital number 1,1,1,1 or decimal digit 15. In the fifth clock pulse, shown in FIG. 2E, any analog charge in excess of 2 cubed, i.e., in excess of 8, is transferred to the well 11-$G_B$ by applying a transfer voltage $V_{GT}$ (FIG. 3) to gate $G_T$. In the illustration, an analog 15 was originally transferred into the well 10-$G_A$ and consequently there will be a transfer of charge equal to analog 7 to the other well 11-$G_B$ of the pair.

In the sixth clock pulse $V_{GA,B}$ is set to analog 7, FIG. 3, and, as shown in FIG. 2F, the highest unit is removed from the well 10-$G_A$. As there was an analog 8 in the well 10-$G_A$ the output is detected as a binary "1", the start of a binary word (1, , ,). In the case (not shown), starting with an analog 7 in the well 10-$G_A$, there would be a "0" (zero) output detected on line 15. The output is actuated by the clock during this last pulse period of the conversion subcycle, and likewise during the ninth, twelfth and fifteenth pulse periods at the ends of the following conversion subcycles.

In the seventh clock pulse, shown in FIG. 2G, the remaining analog charge present in well $G_A$ is dissipated. As there has been a 2 cubed component, i.e., 8, present in the well 10-$G_A$, the logic drive 16 sets the gates to receive the next set of potentials.

In the eighth clock pulse, shown in FIG. 2H, there is a seesaw action between the two wells 10-$G_A$, 11-$G_B$ in which 2 squared, i.e., 4, is retained in the well 11-$G_B$ and the excess, which is 3 in this example, is transferred to the well 11-$G_A$ by operation of the gate $G_T$. This occurs in this particular example because a "1" was detected at the sixth clock pulse.

In the ninth clock pulse, $V_{GA,B}$ is set to analog potential 3 (FIG. 3) and, as illustrated in FIG. 2I, the well 11-$G_B$ is sampled by means of gate $G_B$. The binary word is now known to be (1,1, , ,).

As shown in FIG. 2J, in the tenth clock pulse the remaining analog charge in well 11-$G_B$ is dissipated by operation of gate $G_B$ into the substrate. The logic is now set so the next sample is transferred to the now-empty well 11-$G_B$.

In the eleventh clock pulse, in another seesaw action shown in FIG. 2K, an analog 1 is transferred from well 10-$G_A$ into well 11-$G_B$ by gate GT, leaving an analog 2 in well 10-$G_A$.

In the twelfth clock pulse, $V_{GA,B}$ is set to analog potential 1 (FIG. 3) and, as shown in FIG. 2L, a sample of one unit is produced from well 10-$G_A$ by operation of gate $G_A$. If the sample detected is a "1" it indicates that there was an analog 2 in the well 10-GA so that the binary word is now (1,1,1 ).

In the thirteenth clock pulse, shown in FIG. 2M, the "1" left in well 10-GA is dissipated into the substrate by operation of gate $G_A$.

In the fourteenth clock pulse, shown in FIG. 2N, the remaining charge in well 11-$G_B$ is set for 2 to the zero power and any charge greater than $2°$ remaining in the well 11-$G_B$ is transferred to the well 10-GA. In this case, since there is no charge in excess of 2 to the zero power in well 11-$G_B$, the well 10-GA does not receive a charge.

In the fifteenth clock pulse $V_{GAB}$ is set to analog potential 0 and, as shown in FIG. 2O, a sample of one unit is produced from well 11-$G_B$ and is detected as a "1" if $2°$ is present, to form, in this example, the binary word (1,1,1,1). In this fifteenth and final clock pulse of the sequence, shown in FIG. 2O, any remaining charge in well 11-$G_B$ is dissipated by operation of gate $G_B$.

FIG. 2P represents the sixteenth clock pulse which shows a condition identical to clock pulse 1 in FIG. 2A.

The showing in the top graph of FIG. 3 of $V_{GA}=0$ in the seventh and thirteenth clock periods and $V_{GB}=0$ in the tenth clock period to dissipate the remaining charges present in the corresponding wells of course apply only to the example of decoding a signal value of fifteen. In general, when a "one" has been detected, the voltage on the gate of the corresponding well is set to zero during the first clock period of the next conversion subcycle.

To further illustrate the principle of the converter more examples will be considered.

If the analog charge in well 10-$G_A$ during the fourth clock pulse is an analog one, then it will remain in that well until the fourteenth clock pulse. During the clock pulses 6, 9 and 12, the detector output will indicate digital zeros. Therefore the logic will not cause any charge to be dissipated into the substrate from either well during clock pulses 7, 10 and 13. During the clock pulse 15, a digital "one" will be detected from well 10-$G_A$. Thus the binary word is (0, 0, 0, 1).

If twelve is the value of the analog charge in well 10-$G_A$ during the fourth clock pulse, then during the fifth clock pulse the voltage of 7 units on gate $G_T$ causes a charge of 8 to remain in well 10-$G_A$ and the excess of 4 to be transferred to well 11-$G_B$. When the voltage on gate $G_A$ changes to 7 units with the sixth clock pulse, a digital "one" is detected when the highest unit is removed from well 10-$G_A$. This sets the logic so that during the seventh clock pulse $V_{GA}$ is zero to dissipate the remaining charge in well 10-$G_A$. With the eighth clock pulse the charge of 4 is retained in well 11-$G_B$, and there is no excess for transfer to well 10-$G_A$. Then during the ninth clock pulse the highest unit is removed from well 11-$G_B$ to cause detection of a digital "one", and this sets the logic to make $V_{GB}=0$ during the tenth clock pulse to dissipate the charge in well 11-$G_B$. Thus both wells are now empty, and digital "zeros" are output during clock pulses 12 and 15. The digital output for the full cycle is (1, 1, 0, 0).

If ten is the value of the analog charge in well 10-$G_A$ during the fourth clock pulse, then during the fifth clock pulse a charge of 8 is retained in well 10-$G_A$ and the excess of 2 is transferred to well 11-$G_B$. A digital "one" is detected from well 10-$G_A$ on clock pulse 6, and the remaining charge in that well is dissipated on clock pulse 7. In the eighth clock pulse the voltage of 3 units on transfer gate $G_T$ does not move any charge to well 10-$G_A$, and the charge of 2 remains in well 11-$G_B$. In the ninth clock pulse the change of voltage on gates $G_A$ and $G_B$ to 3 units does not cause any charge to be removed from the wells, and a digital "zero" is output. In the clock pulse 11, the voltage of 1 unit on gate $G_T$ again does not cause any charge to be transferred and the value in well 11-$G_B$ is still 2. In the clock pulse 12 a digital "one" is detected from well 11-$G_B$, and the remaining charge is dissipated on clock pulse 13. Now both wells are empty and a "zero" is output in clock pulse 15. Thus the digital output is (1, 0, 1, 0).

In the present invention an ultra-small silicon integrated circuit uses a simple weight balance measuring principle. A pair of chargeable potential wells (capacitor pairs) which may be formed and controlled as in other charge-coupled devices forms the metering balance. An electronic charge which is admitted to one side of the capacitor pair is linearly related to the analog voltage signal. A seesawing action between the two wells is controlled by a transfer gate located between them and completes the metering system. As described above, an important electronic application of this simple charge transfer device is the conversion of analog signal quantities to digital quantities.

The mathematical basis from which the charge coupled A/D device of the present invention is derived consists of the simple equation $$2^k = \left( \sum_{i=0}^{i=k-1} 2^i \right) + 1, \text{ where } i > k \geq m, \text{ and}$$

i, k and m are integers. This equation states that the $k^{th}$ element in the integer power series of the base 2, for example, k=4 in the example of FIGS. 2A-2D, has the same numerical value as the sum of all of the lesser elements of the series plus the quantity one. It is the ever present unity term which suggests the possibility of using paired potential wells for the conversion of analog signals to the digital form. In making a consecutive series of balance measurements, the presence or absence of each descending power series element is detected.

After the presence or absence of each descending power series element is detected, the electronic charge representing that particular element, if present, is removed by an auxiliary transfer action, for example, to a sink. This cycle is repeated until the presence of all series elements are detected. The output data consists of a sequence of m bi-level type voltage pulses corresponding to the m-bit binary word equivalent of the input analog data.

In the example described above, fifteen clock periods were required to convert a four-bit word. It is believed, and experiments have indicated, that megahertz conversion rates are possible with the design of the present invention. The bit size depends upon the dynamic range and linearity of the input injection circuit, the kTC noise, surface state trap density, thermal dark current density and the inversion threshold uniformity existing within the small active-electrode area (10 mils$^2$) of the device. A ten-bit unitary charge couple circuit analog-to-digital converter is possible. Converters having a capacity of more than 10 bits are possible by connecting the individual units in parallel.

What is claimed is:

1. An analog-to-digital converter which is an integrated circuit charge coupled device having a substrate and a pair of charge packet potential wells comprising a first well and a second well for converting an analog signal to an M-bit binary code, said wells having first and second holding gates respectively;

input means to insert charge packets representing analog values of samples of the input analog signal into said first well;

transfer means including a transfer gate to transfer charge packets from the first well to the second well and from the second well to the first well;

substrate detection means for output of "one" or "zero" values for the M-bits of each sample control means comprising logic, drive, and clock circuits coupled to said holding gates, to said input means, to said transfer gate, and to said detection means, with the clock circuits providing clock signals in repetitive cycles to convert one sample per cycle, each cycle being divided into an input subcycle plus M conversion subcycles of three phases each; the conversion subcycles being designated by the sumbol K, with the first conversion subcycle having K=M, the second K=M−1, and K decreasing by 1 until its value is 1 for the Mth conversion subcycle;

the converter being operative during the first conversion subcycle following the input subcycle to place a voltage of ($2^m-1$) units (the voltage units being of a fixed predetermined value) on both of said holding gates during the first and second clock phases and a voltage of ($2^{m-1}-1$) units during the third clock phase, and to place a voltage of ($2^m-1$) units on the transfer gate during the second clock phase, so that the full analog charge packet representing the input sample is in the first well during the first clock phase, and any charge in excess of ($2^{m-1}$) is transferred to the second well during the second clock phase, then during the third clock phase said detection means is actuated to detect whether the first well has a charge in excess of ($2^{m-1}-1$) to output a "one" or otherwise to output a "zero";

the converter being further operative during subsequent conversion subcycles to place a voltage of ($2^{k-1}-1$) units on both of said holding gates during the first and second clock phases and a voltage of ($2^{K-1}-1$) units during the third clock phase, except that if the bit output in the preceding subcycle was a "one" then the voltage on the holding gate is changed to zero during the first clock phase for that well which produced the output signal to dissipate its charge into the substrate, so that at the end of the first clock phase only one well of said pair contains a charge packet, and any charge in excess of ($2^{k-1}$) is transferred to the other well during the second clock phase, then during the third clock phase said detection means is actuated to detect whether said one well has a charge in excess of ($2^{k-1}-1$) to output a "one" or otherwise to output a "zero".

2. An analog-to-digital converter as set forth in claim 1, herein said detection means comprises impedance means coupled to said substrate so that any charge removed from either well of said pair by reducing the voltage on its holding gate produces a signal at the impedance means, the detection means being actuated to produce an output signal during said third clock phase of each conversion subcycle.

3. An analog-to-digital converter as set forth in claim 2, wherein said impedance means comprises a resistor and a capacitor in parallel.

4. An integrated circuit as in claims 1, 2 or 3 wherein said wells are capacitors formed on a silicon substrate as a portion of a metal-oxide-semiconductor circuit on said substrate.

5. An integrated circuit as in claims 1, 2 or 3 wherein said wells are heterojunction potential barriers formed on said substrate.

6. An integrated circuit as in claims 1, 2 or 3 wherein said wells are homojunction potential barriers formed on said substrate.

7. An integrated circuit as in claims 1, 2 or 3 wherein said wells are Schottky potential barriers formed on said substrate.

8. An integrated circuit as in claims 1, 2 or 3 wherein said electrode gates are gates of metal-oxide-semiconductor field effect transistors.

9. An integrated circuit as in claims 1, 2 or 3 which is an analog-to-digital converter having an integral clock which operates at a 15 megahertz rate to provide a megahertz 4-bit word conversion rate.

10. An integrated circuit as in claims 1, 2 or 3 wherein said logic control is a metal-oxide-semiconductor programmed read-only memory.

* * * * *